United States Patent [19]

Schwendeman

[11] Patent Number: 5,974,180
[45] Date of Patent: Oct. 26, 1999

[54] TEXT COMPRESSION TRANSMITTER AND RECEIVER

[75] Inventor: Robert John Schwendeman, Pompano Beach, Fla.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/581,953

[22] Filed: Jan. 2, 1996

[51] Int. Cl.$^6$ .................................................. G06K 9/36
[52] U.S. Cl. .......................... 382/232; 358/431; 341/107
[58] Field of Search .................................. 382/232, 239, 382/244, 233, 235, 245, 246, 247; 341/51, 90, 106, 67, 107; 358/431, 261.1, 261.2, 427

[56] References Cited

U.S. PATENT DOCUMENTS

| | | | |
|---|---|---|---|
| 3,935,591 | 1/1976 | Hopkins | 348/484 |
| 4,843,389 | 6/1989 | Lisle et al. | 341/106 |
| 5,109,433 | 4/1992 | Notenboom | 382/240 |
| 5,239,298 | 8/1993 | Wei | 341/51 |
| 5,270,712 | 12/1993 | Iyer et al. | 341/67 |
| 5,283,570 | 2/1994 | DeLuca et al. | 340/825.4 |
| 5,396,228 | 3/1995 | Garahi | 341/106 |
| 5,426,426 | 6/1995 | Hymel | 340/825.55 |
| 5,621,466 | 4/1997 | Miyane et al. | 348/405 |

FOREIGN PATENT DOCUMENTS

| | | | |
|---|---|---|---|
| 0536832A1 | 9/1992 | European Pat. Off. | G08B 5/22 |
| 0 536 831 A1 | 4/1993 | United Kingdom | G08B 5/22 |
| 95/02873 | 1/1995 | WIPO | G08B 5/22 |
| WO 95/02873 | 1/1995 | WIPO | G08B 5/22 |

OTHER PUBLICATIONS

Pike, Text compression using a 4 bit coding scheme, 1981, pp. 324–330.

T. Bell, "Text Compression", Chap. 8, pp. 212–214.

J. Pike, "Text Compression Using a 4 Bit Coding Scheme", The Computer Journal, vol. 24, No. 4, 1981 pp. 324–330.

William D. Schieber, George W. Thomas, "An Algorithm for Compaction of Alphanumeric Data", Journal of Library Automation vol. 4/4 Dec. 1971, pp. 198–206.

*Primary Examiner*—Amelia Au
*Assistant Examiner*—Timothy M. Johnson
*Attorney, Agent, or Firm*—James A. Lamb

[57] ABSTRACT

A text compression technique used in a transmitter subsystem (126, 148) and a receiver subsystem (132, 158) for compressively encoding and decoding a text portion of a message by using tokens having at least two data symbol lengths. During encoding, a quantity of fill symbols are added to a sequence of secondary tokens, wherein the quantity of fill symbols is determined such that a total quantity of the data symbols in the sequence is equal to an integral multiple of the quantity of the data symbols having a first data symbol length. Delimiting characters such as spaces which precede a sequence of characters corresponding to a primary token are indicated by setting one data symbol in each primary token to a predetermined value. Sequences of capitalized characters are indicated by predetermined command tokens.

15 Claims, 5 Drawing Sheets

TEXT COMPRESSION TRANSMITTER AND RECEIVER

FIELD OF THE INVENTION

This invention relates in general to compressively coding text messages and in particular to apparatus which is optimized for compressively encoding and decoding short text messages in a selective call radio communication system.

BACKGROUND OF THE INVENTION

Known techniques of compressively coding text messages include fixed dictionary techniques and adaptive dictionary techniques, in which a table of tokens is maintained at both a transmitter and a receiver. The table of tokens, or token table, associates a word of data symbols with a character or sequence of characters in an alphanumeric, or text, message. In both the fixed and adaptive dictionary techniques, frequently used sequences of characters, including all the necessary single characters of the alphabet, numbers, and punctuation characters, are included in the token table or tables. During compression encoding, sequences of characters in the text messages are sought which match a sequence within the token table and the matching sequence of characters is replaced by the token, with the expectation of shortening the number of data symbols needed to communicate the text message. The process is repeated in reverse at the receiver.

Fixed dictionary techniques have been used for many years, while adaptive dictionary techniques have proliferated extensively in the last several years during the continued burgeoning of data communications. Although fixed dictionary techniques have been successfully used for long data files, they are not as efficient as adaptive dictionary techniques for the transfer of long data files, which explains the investigation and success of adaptive compression techniques in recent years Some communication systems, such as paging systems, provide message communication of messages which are quite short on the average, in comparison to many other systems. For these systems, the overhead involved in an adaptive compression coding technique is typically not as efficient as using a fixed dictionary technique. However, existing fixed dictionary techniques themselves have not evolved significantly in the last decade and have been oriented towards longer messages.

Thus, what is needed is an improved fixed dictionary technique for compressively encoding and decoding short text messages. Such a technique would, of course provide compression of a long message as well

DETAILED DESCRIPTION OF THE DRAWINGS

Described herein below, are a method and apparatus for compressively encoding a text message by a sender and for decompressively decoding the text message by a receiver. The method and apparatus are most beneficial for a selective call communication system transmitting text messages, however it will be appreciated that the present invention described herein can also be beneficially applied to other communication systems transmitting text messages as, for example, an infra-red communication system using infra-red transmitters and receivers, or a wired communication system using wired receivers and transmitters.

Figure 1:
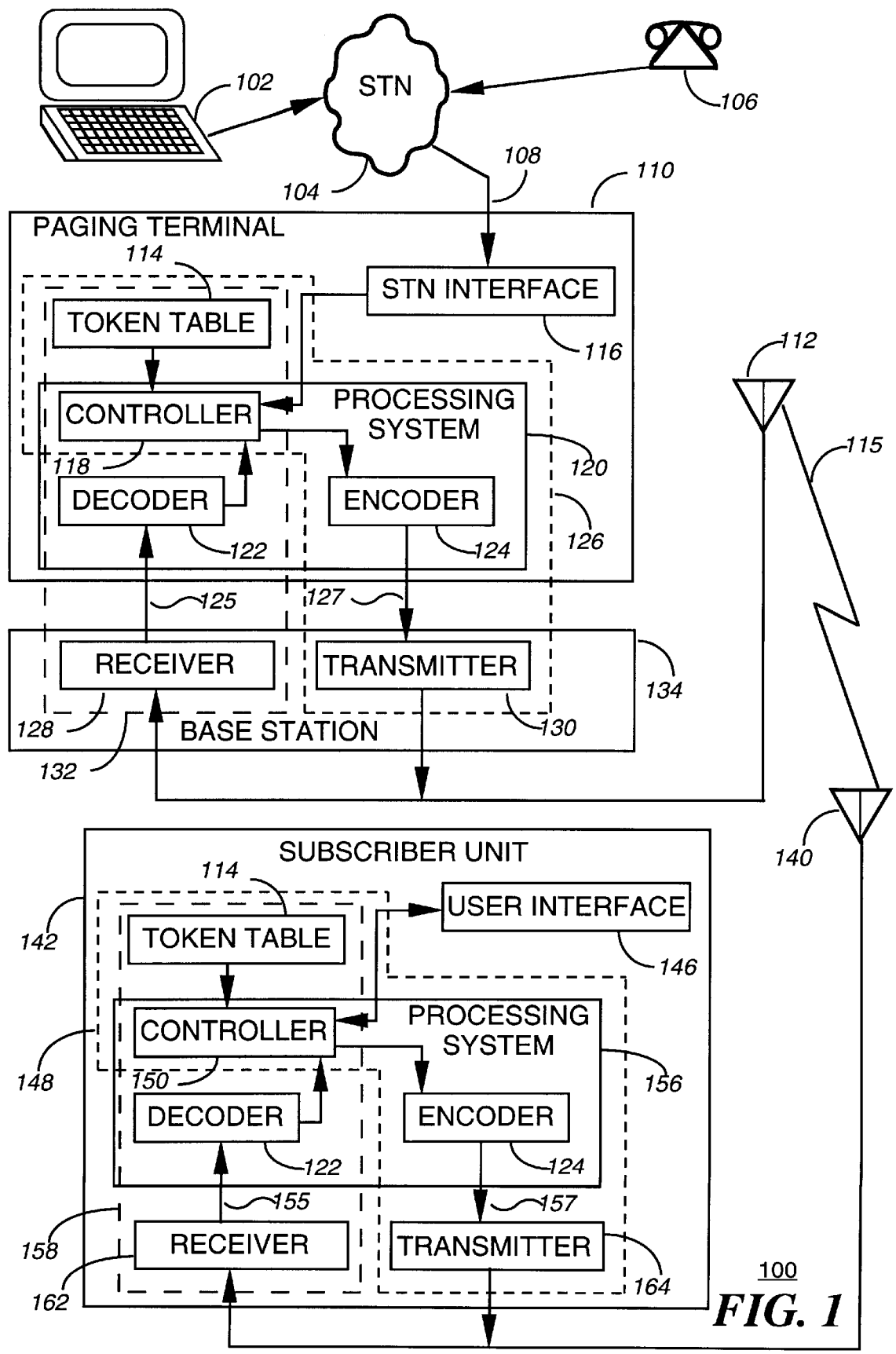
FIG. 1 is an electrical block diagram of a radio communication system, in accordance with the preferred embodiment of the present invention.

Referring to FIG. 1, an electrical block diagram of a radio communication system 100, is shown in this example as a paging system, in accordance with the preferred embodiment of the present invention. The radio communication system 100 comprises a message input device, such as a conventional messaging terminal 102, or a conventional telephone 106, connected through a conventional switched telephone network (STN) 104 by conventional telephone links 108 to a paging terminal 110 and base station 134. The network described herein as the STN 104 includes networks such as public switch telephone network (PSTN) and private branch exchanges (PBX). The paging terminal 110 is coupled to a subscriber unit 142 via a conventional base station antenna 112, a radio signal 115, and a subscriber antenna 140.

The paging terminal 110 oversees the operation of one of more base stations 134, through one or more communication links which include a demodulated signal 125 and a modulating signal 127. The communication links typically are twisted pair telephone wires, and additionally can include RF, microwave, or other high quality audio communication links. The base stations 134 comprise a radio frequency transmitter 130 and a radio frequency receiver 128. The radio frequency transmitter 130 and radio frequency receiver 128 are coupled to the conventional base station antenna 112. It will be appreciated, that in order to meet the requirements of different systems, the base station 134 may or may not be collocated with the paging terminal 110 and the radio frequency receiver 128 may or may not be collocated with the radio frequency transmitter 130. A separate conventional base station antenna 112 can be used with the radio frequency transmitter 130 and the radio frequency receiver 128.

The paging terminal 110 and the base station 134 comprise a receiver subsystem 132 and a transmitter subsystem 126 coupled to the conventional base station antenna 112. The transmitter subsystem 126 comprises a controller 118 coupled to a memory for storing a token table 114, an encoder 124 for compressively encoding a text message coupled to the controller 118 and a radio frequency transmitter 130 coupled to the encoder 124. The controller 118 and the encoder 124 are part of a processing system 120. The encoder 124 couples a modulating signal 127 to the radio frequency transmitter 130, which is part of the base station 134. The receiver subsystem 132 comprises controller 118 coupled to the memory for storing the token table 114, a decoder 122 coupled to the controller 118 for compressively decoding a text message and a receiver coupled to the decoder 122. The controller 118 and the decoder 122 are part of a processing system 120. The radio frequency receiver 128, which is part of the base station 134 couples a demodulated signal 125 to the decoder 122. The controller 118 is also coupled to a STN interface 116. The STN interface 116 is coupled to the STN 104 to provide the interface between the STN 104 and the controller 118. The functions provided by the STN interface 116 include STN supervisory functions, analog to digital conversion and digital to analog conversion.

The subscriber unit 142 comprises a receiver subsystem 158 and a transmitter subsystem 148 coupled to a subscriber antenna 140. The transmitter subsystem 148 comprises a controller 150 coupled to a conventional memory for storing a unique token table 114, a unique encoder 124 coupled to the controller 150 for compressively encoding a text message and a transmitter 164 which is a conventional radio transmitter in accordance with the preferred embodiment of the present invention, coupled to the encoder 124. The controller 150 and the encoder 124 are part of a processing system 156. The encoder 124 couples a modulating signal 157 to the transmitter 164. The receiver subsystem 158 in this example is a selective call receiver. The receiver subsystem 158 consist of the conventional controller 150 coupled to the memory for storing the token table 114, a decoder 122 for compressively decoding a text message coupled to the controller 150 and a receiver 162 which is a radio receiver in accordance with the preferred embodiment of the present invention, coupled to the decoder 122. The controller 150 and the decoder 122 are part of a processing system 156. The receiver 162 couples a demodulated signal 155 to the decoder 122. The controller 150 is also coupled to a user interface 146. The user interface 146 provides the interface between the user and the subscriber unit 142. The user interface 146 comprises buttons and other controls for the user to enter commands and messages to the controller 118, alerting devices such as an alert tone generator, a light emitting diode (LED) indicator, and/or a graphic display to alert the user of pertinent information and amplifiers and transducer devices to convey voice information to the user.

The paging terminal 110 encodes and decodes inbound and outbound messages. The paging terminal 110 also functions to schedule outbound messages, which can include such information as analog voice messages, compressed text messages, and response commands, for transmission by the base stations 134 to one or more of a plurality of subscriber units 142. The paging terminal 110 further functions to decode inbound messages, including unsolicited and solicited response messages, received by the base station 134 from the plurality of subscriber units 142.

An example of an outbound compressed text message intended for a subscriber unit 142 is an alphanumeric page message entered from the conventional messaging terminal 102. An example of an outbound analog message intended for a subscriber unit 142 is a voice page message entered from the conventional telephone 106. Examples of response messages are acknowledgments and demand response messages. An acknowledgment is an inbound message transmitted by a subscriber unit 142 that indicates successful reception of an outbound message. A demand response message is a message sent from a subscriber unit 142 in response to a command included in an outbound message from the paging terminal 110. An example of a demand response message is a compressed text message initiated by the subscriber unit 142, but which is not transmitted until after a demand response command is received from the paging terminal 110. The demand response command, in turn, was sent by the paging terminal 110 after an inbound message requesting permission to transmit the demand response message was communicated from the subscriber unit to the paging terminal 110. An unsolicited message is an inbound message transmitted by a subscriber unit 142 without having received an outbound message which requires a response. An example of an unsolicited message is an inbound message from a subscriber unit 142 which alerts the paging terminal 110 that the subscriber unit 142 is within radio range of the base station 134. An unsolicited message can include a request to transmit a scheduled or demand response which can include data such as compressed text message. The inbound and outbound messages are included in outbound radio signals transmitted from, and inbound radio signals received by, the conventional base station antenna 112 that is coupled to the radio frequency transmitter 130 and radio frequency receiver 128.

It should be noted that the paging terminal 110 is capable of operating in a distributed transmission control environment that allows mixing conventional cellular, simulcast, satellite, or other coverage schemes involving a plurality of radio frequency transmitters 130 and radio frequency receivers 128, conventional base station antenna 112, for providing reliable radio signals within a geographic area as large as a worldwide network. Moreover, as one of ordinary skill in the art would recognize, the telephonic and selective call radio communication system functions may reside in plurality of paging terminals 110 which operate either independently or in a networked fashion. It will be further appreciated that although the system described herein is a two way communication system, the text compression described is applicable to a one way system as well, for example, a one way paging system or a one way message broadcast system.

The subscriber data base stores information for each subscriber, including a correlation between a selective call address assigned to each subscriber unit 142 and the telephone number used within the STN 104 to route messages and telephone calls to each subscriber unit 142, as well as other subscriber determined preferences, such as hours during which messages are to be held back from delivery to the subscriber unit 142. The processing system 120 stores outbound messages which are queued for delivery to at least one of the plurality of subscriber units 142.

The paging terminal 110 is preferably a model MPS2000 ® paging terminal manufactured by Motorola, Inc., of Schaumburg Ill. The radio communication system 100 of the present invention preferably utilizes a synchronous frame structure similar to FLEX™ (a high speed paging protocol by Motorola, Inc. of Schaumburg, Ill.).

It will be appreciated that the subscriber unit 142 is one of several types of radios, including two way and one way pagers, conventional mobile radios, conventional or trunked mobile radios which have a data terminal attached thereto, or which optionally have data terminal capability designed in. Each of the subscriber units 142 assigned for use in the radio communication system 100 has an address assigned thereto which is a unique selective call address. The address enables the transmission of a message from the paging terminal only to the addressed subscriber unit 142, and identifies messages and responses received at the paging terminal 110 from the subscriber unit 142. Furthermore, each of one or more of the subscriber units 142 can have a unique telephone number assigned thereto, the telephone number being unique within the STN 104. A list of the assigned selective call addresses and correlated telephone numbers for the selective call radios is stored in the paging terminal 110 in the form of a subscriber data base. The subscriber data base is stored in the processing system 120.

Figure 2:
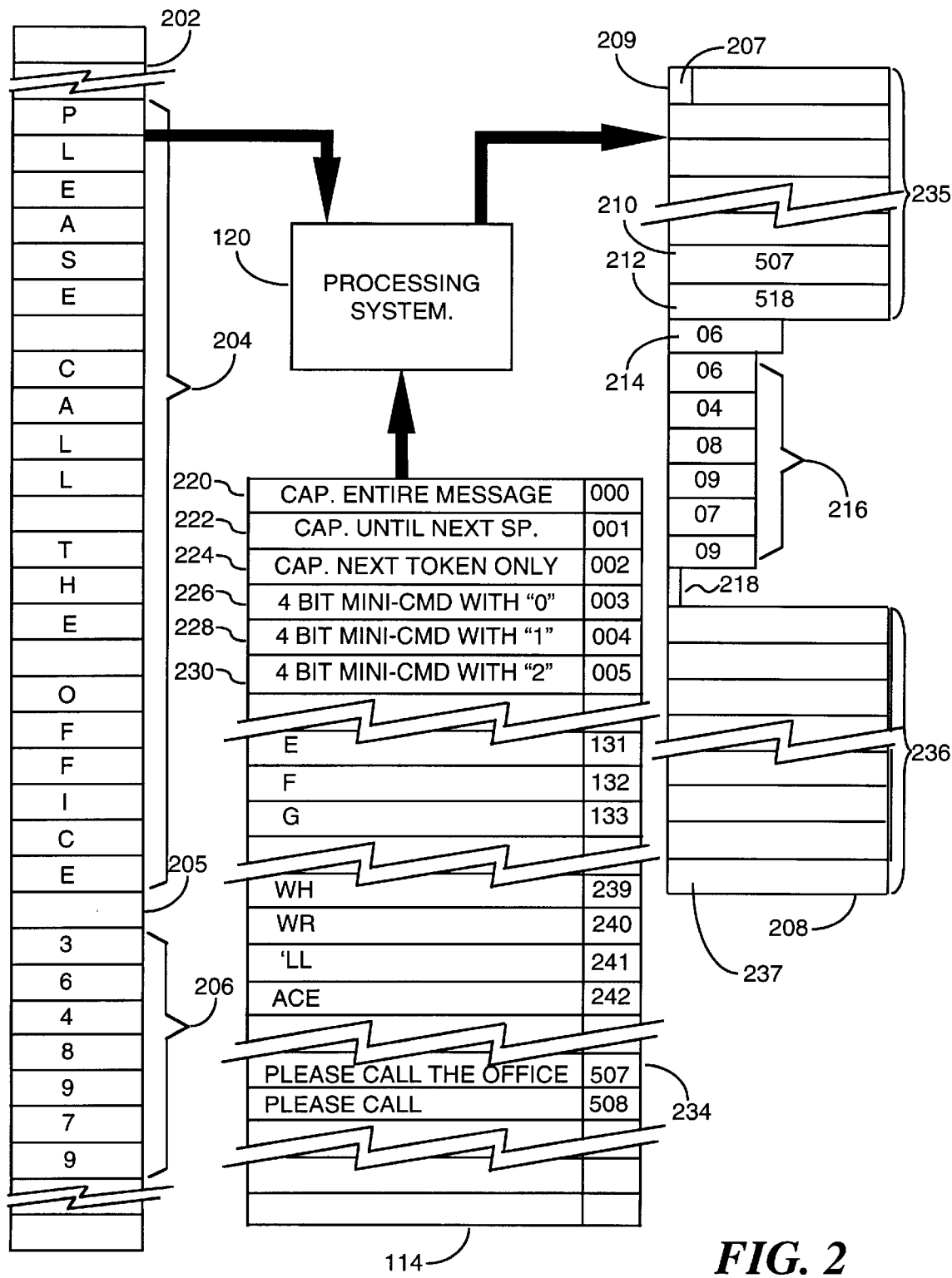
FIG. 2 is a graphic illustration of the text compression process used in the radio communication system shown in FIG. 1, in accordance with the preferred and alternative embodiments of the present invention.

FIG. 2 is a graphic illustration of the text compression encoding process performed by the encoder 124, in accordance with the preferred embodiment of the present invention. The compression process encodes a text portion of a text file 202, generating a compressed text portion of the message using tokens having at least two data symbol lengths. In the example used herein, there are tokens, called primary and secondary (or mini) tokens, having three different data symbol lengths. All tokens are comprised of data symbols, which are preferably bits. In this example, the primary tokens have a first data symbol length, preferably ten bits in length. The secondary tokens have a second data symbol length, which can be either four or five bits in length. Each primary token and secondary token has a predetermined data symbol pattern and represents a unique sequence of one or more characters stored in one or more token tables 114, or is a command token. As will be described in more detail later, a command token can additionally represent a unique sequence of one or more characters. One data symbol 207 of each primary token 209, 210, 212, preferably the most significant bit, is a leading delimiting character indicator and the remaining nine bits are used to reference the token table 114. When a character or a string of characters which are being compressed is preceded by a delimiting character (which is preferably a space character), the leading delimiting character indicator is set to a predetermined first value, preferably one. Otherwise, the leading delimiting character indicator is set to a predetermined second value, preferably zero. The one data symbol 207 is also referred to herein as a flag data symbol. This technique of encoding the space character is highly efficient in communication systems transmitting text based on alphabets which require spaces to separate words, such as English text. In another use, such as a communication system in which forms are prevalent and fields are separated by slashes, it could be more efficient to use the flag symbol to identify a slash.

The token table 114 comprises a series of characters, character sequences, and phrases associated with corresponding predetermined primary tokens and predetermined secondary tokens, which may be stored in the same memory, or may be associated with the tokens and tokens, for example, by a computation based on an address of the beginning of each phrase or character. The token table 114 preferably contains three hundred ninety-one character sequences, fifteen phrase sequences, and 76 ASCII characters. The three hundred ninety-one sequences are character groupings which include whole words and word fragments which are commonly used within outbound text messages in the radio communication system 100. Examples of commonly used words and word fragments are "the", "and", "call", "th", "ing" and "er". A character sequence of one or more characters associated with a primary token is called a primary character sequence. A character sequence of one or more characters associated with a secondary (mini) token is called a secondary character sequence. A character sequence can be a primary or secondary character sequence, or both. In this example, digits are both primary and secondary character sequences (single character sequences). The thirty command tokens are comprised of data symbols, and have the first data symbol length. The thirty command tokens have a predetermined symbol pattern different from those of the primary tokens associated with the three hundred ninety-one character sequences, fifteen phrase sequences, and 76 ASCII (American Standard for Coded Interchange of Information) characters. The thirty command tokens are of two types: capitalization command tokens and mini-token command tokens. The mini-token command tokens have multiple purposes: to indicate that a sequence of mini-tokens follows, to indicate the length of the mini-tokens in the sequence, and to encode a most frequently used character. The set of most frequently used characters of which one can be encoded by a mini-token command token include the digits and character strings commonly found with numbers. For example the word "call" would often precede a telephone number. Mini-token sequences are initiated by adding a mini-token command token and a mini-token header immediately preceding a sequence of mini-tokens which indicates a start of the sequence of mini-tokens.

The three hundred ninety-one character sequences encoded by tokens are selected by analyzing word frequency observed during a long term study of the message traffic in the radio communication system 100, which in this example is common paging traffic. The observed traffic is analyzed by conventional methods for repeating character sequences and each sequence is assigned a weight indicating its frequency of occurrence. These sequences include commonly used whole words. The larger weights are associated with the higher frequencies of occurrence. The sequences with the largest weights are selected. The selected sequences are removed and the process is repeated on the remaining sequences. This process is repeated until the required number of fragments are selected. It will be appreciated that there are alternative conventional methods for determining the set of most frequently used sequences. In this example, with a primary token symbol length of ten and one of those ten dedicated to the flag symbol, there are 512 symbol patterns available as tokens and command tokens. With 30 command tokens defined and 76 ASCII characters, a quantity of 406 primary tokens remains, so the 406 most frequent character sequences and phrases are determined. It will be appreciated that the technique described herein would work nearly as well with modifications to the number of data symbols in each primary token and the number of command tokens chosen. In systems having different message statistics (for example, average length and subject matter), a different primary token length could provide better improvement.

There are three capitalization command tokens. The first capitalization command token 220 is used to indicate the whole message is to be capitalized. The second command token 222 is used to indicate that all the following characters to the next space are to be capitalized, or the following mini-token sequence is to be capitalized. The third command token 224 is used to indicate that the next token is to be capitalized.

There are preferably twenty-seven mini-token command tokens. Mini-token command tokens cause the decoding to change from using primary tokens having a first data symbol length, preferably ten bits, to using mini-tokens having a second data symbol length of preferably four bits or five bits as specified by the mini-token command token. Two sets of mini-token command tokens are provided to make optimum utilization of the available symbols. The first set of mini-token command tokens causes the text to be encoded using four bit mini-tokens, while the second set causes the text to be encoded using five bit mini-tokens. Each set includes a number of mini-token command tokens, each of which defines a character sequence. The characters that are defined by the mini-token command tokens that cause the succeeding tokens to be encoded using four bit tokens include the digits "0" 226 (FIG. 2), "1" 228 (FIG. 2), "2" 230 (FIG. 2), the digits "3" through "9", and the string "at". The characters that are defined by the mini-token command tokens that cause the succeeding tokens to be encoded using five bit tokens include the digits "0" through "9" and the strings "at", "pls", "call", and the character "(".

The number of mini-tokens in a sequence of mini-tokens is indicated by a token sequence header which is added immediately after the mini-token command token by the encoder 124. The token sequence header is also referred to herein as a mini-token header. The mini-token header has a predetermined symbol length, which, in accordance with the preferred embodiment of the present invention, is five bits, but which, in an alternative embodiment of the present invention, could be another length, such as the primary data symbol length (10 bits) or another secondary data symbol length (4 bits). The mini-token header is used to identify an end of a sequence of mini-tokens by indicating the number of mini-tokens to follow. Fill symbols 218 are added following the mini-tokens. The fill symbols are added such that a total quantity of the data symbols in the sequence, including the mini-token header, is equal to an integral multiple of the first data symbol length. When an error occurs, the decoder is sometimes mistakenly diverted to decoding mini-tokens by decoding a primary token which includes the error as a command token for shifting to mini-tokens.

When this happens, the fill symbols 218 provide for the decoding sequence to revert to the first symbol length, ten bits, and to be in synchronization with the incoming data 236 (FIG. 2) after mini-token decoding is completed. The decoder is programmed to revert to the first symbol length after the maximum number of mini-tokens is received. The maximum number is preferably thirty-one. (Thirty-one is the largest number that can be specified by a five bit number.) When an error occurs which causes the decoder to fail to decode a command token or a mini-token header, the fill symbols 218 also provide that the decoding sequence remains at the first symbol length, ten bits, and therefore remains in synchronization with the incoming data 236 (FIG. 2). In both cases described, the use of fill symbols reduces error propagation.

A portion of a text file 202 (FIG. 2) is shown by way of example, which contains a text phrase 204 ("please call the office"), and a telephone number 206 ("3648979"). The processing system 120 encodes the text file 202 using the token table 114 into a series of tokens stored in the token file 208. The text phrase 204 "please call the office" is found in the token table 114 at location 234. The number 507 is the decimal representation of the equivalent nine bit binary word defining the token. Since there is no space preceding the phrase "please call the office", a most significant value of 0 is appended to the token, creating a token of the same value, 507. The token is stored in the series of tokens stored in the token file 208 at location 210. The telephone number 206 is encoded by the processing system 120 as a mini-token series. The first digit of the telephone number 206, "3" is included in the four bit mini-token command token. The decimal value of the four bit mini-token command token which includes the character "3" is 006, however there is a delimiting space character 205 preceding the first digit and therefor the most significant bit is set to one, indicating a leading space, and the resulting decimal value is 512 plus 006, or 518. The resulting ten bit mini-token command token is stored at location 212. Following the mini-token command token stored at location 212 is a five bit mini-token header stored at location 214. The mini-token header stored at location 214 indicates the number of mini-tokens to follow. In this example there are six digits, "648979", encoded as the series of corresponding four bit mini-tokens 216 so the number six is stored in binary at location 214. Next a number of fill symbols 218 are added to make the number of bits in the mini-token header stored at location 214 plus the number of bits in the series of four bit mini-tokens 216 plus the number of bits in the fill symbols 218 be a number integrally dividable by the first symbol length. In this example, one bit is added, making the total number of bits in the mini-token header and the mini-tokens equal to 30.

It will be appreciated that the number of equivalent first symbol lengths which have the same total length as the sequence could be indicated in the mini-token header instead of the number of mini-tokens, typically allowing the use of a smaller number in the mini-token header, but requiring slightly more complicated decoding methods. Thus, the mini-token header could be four bits in an alternative embodiment of the present invention.

In an alternate embodiment of the present invention the encoder 124 includes a revert command in the message which indicates the end of the second data symbol length. The mini-token header stored at location 214 is replaced by the revert command which moves from the start of the mini-token sequence to the end of the mini-token sequence. The revert command preferably has the same number of bits as the mini-tokens used in the mini-token sequence. The calculation of total data symbols to determine the number of fill bits includes the revert command.

Figure 3:
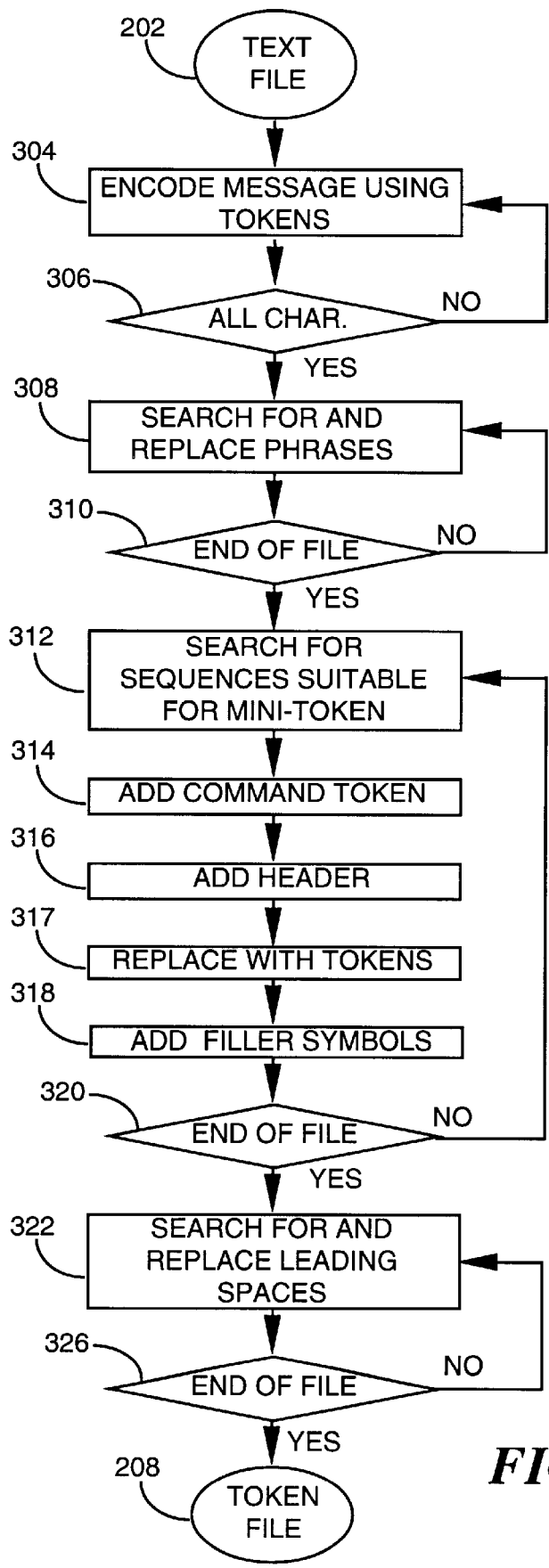
FIG. 3 is a flow chart showing the step of compressively encoding a text message utilized by the radio communication system shown in FIG. 1, in accordance with the preferred and alternative embodiments of the present invention.

FIG. 3 is a flow chart showing the method of compressively encoding a text message performed by the encoder 124. The method shown in the flow chart 300 uses a four pass method of encoding the text file 202 to produce a corresponding token file 208.

The first pass comprises step 304 and step 306 at which the whole text message is encoded in tokens by the encoder 124. During the first pass the text file 202 is encoded using the three hundred ninety-one primary tokens that represent the commonly used character groupings which include whole words and word fragments. At step 304 the token table 114 is searched to match the longest strings of characters in the token table 114 to portions of the text file 202. Command tokens for capitalization are also added at step 304. Next at step 306 a test is made to determine if all the When not all the characters have been replaced the process is repeated at step 304 using the next longest strings of characters in the token table 114 until at step 306 it is determined that all the characters have been replaced with primary tokens 235,236 (FIG. 2) and the encoder 124 continues with the second pass.

The second pass comprises step 308 and step 310 at which strings of primary tokens representing phrases, contained in the token file 208 produced in the first pass, are replaced with primary tokens which are phrase tokens by the encoder 124. At step 308 the file containing the series of tokens produced in the first pass are compared to phrases in the token table 114. Series of primary tokens that match phrases in the token table 114 are replaced with phrase tokens. Next at step 310 a test is made to determine if the end 237 (FIG. 2) of the token file containing the series of tokens 235, 236 (FIG. 2) has been reached. When the end 237 (FIG. 2) of the file has not been reached the encoder 124 continues at step 308 until at step 310 it is determined that the end 237 (FIG. 2) of the file containing the series of tokens has been reached and the encoder 124 continues with the third pass.

The third pass comprises step 312 through step 320 where strings of tokens, contained in the file produced in the second pass, suitable for representation by mini-tokens are replaced with mini-tokens by the encoder 124. At step 312 the file is searched for a string of tokens that can be represented with mini-tokens. Typically these strings of tokens represent strings of digits, such as a telephone number. When a suitable string is found at step 314 a mini-token command token is added. When the first token of the string of tokens to be represented by mini-tokens represents a digit, a mini-token command token is selected which includes that digit. Next at step 316 a mini-token header is added to indicate the number of mini-tokens to follow. Then at step 317, the remaining tokens of the string are replaced with mini-tokens. Next at step 318 a number of fill bits are added such that the total number of bits in the mini-token header plus the number of bits in the series of mini-tokens is integrally divisible by the primary token length. Then at step 320 a test is made to determine whether the end 237 (FIG. 2) of file has been reached. When the end 237 (FIG. 2) of the file has not been reached, the search for strings of tokens suitable for representation by mini-tokens continues at step 312. When at step 320 the end 237 (FIG. 2) of file has been reached the encoder 124 continues with the fourth pass. When at step 312 the end 237 (FIG. 2 of the file has not been reached the encoder 124 continues to search for strings of tokens suitable for representation by mini-tokens, at steps 312–320 as described above.

The fourth pass comprises step 322 and step 326, at which leading delineating spaces in the strings of tokens, contained in the file produced in the third pass, are removed and the leading delimiting character indicator is set by the encoder 124. At step 322, the string of tokens 235, 214, 216, 218, 236 (FIG. 2) contained in the file produced by the third pass is searched for space tokens. When a space token is found, the space token is removed and the leading delimiting character indicator of the next token is set. Next at step 326 test is made to determine if the end of the file has been reached. When the end 237 (FIG. 2) of the file has not been reached at step 326 the encoder 124 continues to search for the next space token at step 322. When the end 237 (FIG. 2) of the file has been reached at step 326 the token file 208 is complete.

Figure 4:
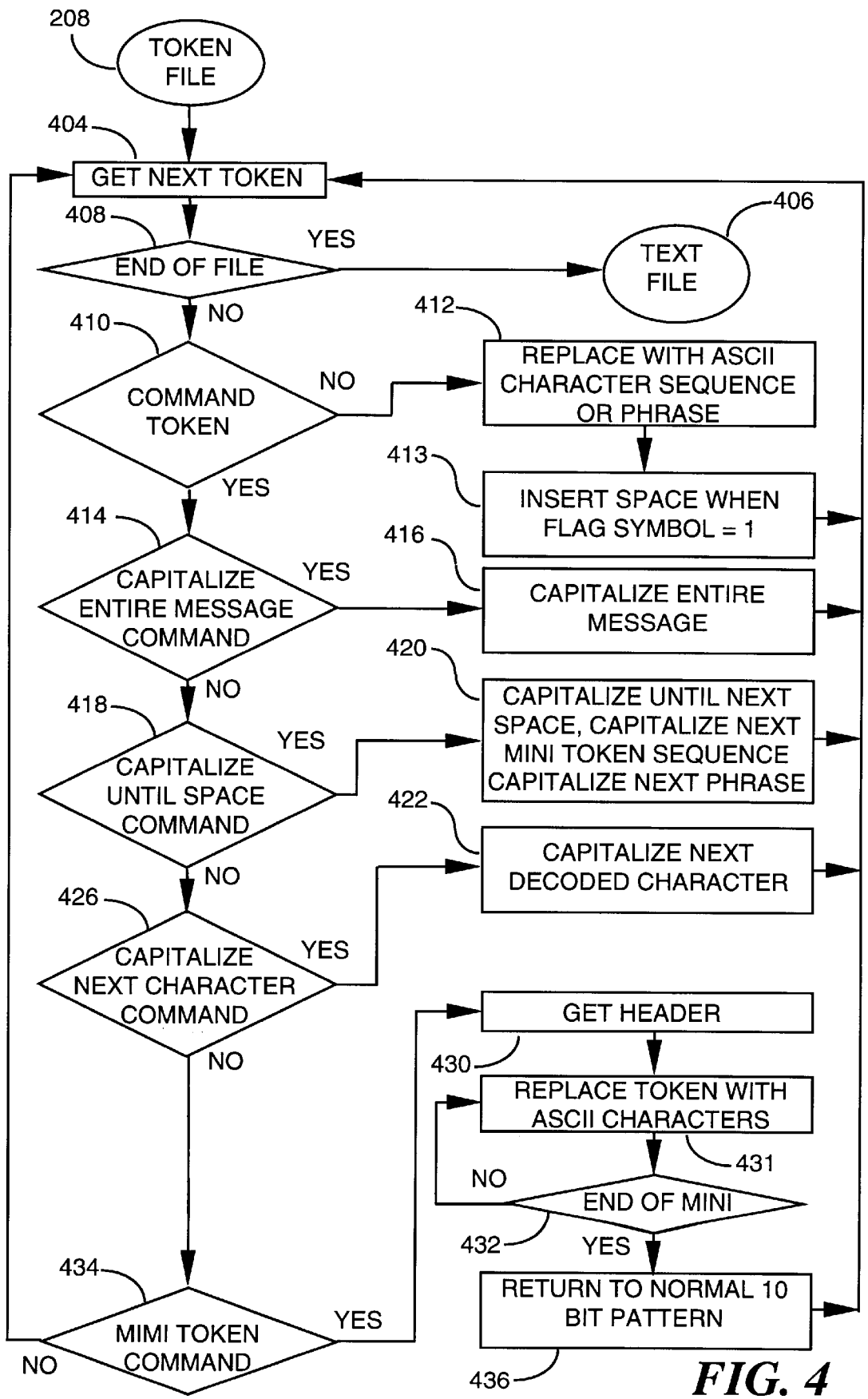
FIG. 4 is a flow chart showing the step of decompressively decoding a text message utilized by the radio communication system shown in FIG. 1, in accordance with the preferred embodiment of the present invention.

FIG. 4 is a flow chart showing the method of decompressively decoding a series of tokens in the token file 208 by the decoder 122 to produce a corresponding uncompressed text file 406. Each token in the token file 208 represents a unique sequence of one or more characters or a command token.

The decompression process starts at step 404 where a data word having a data symbol length equivalent to a primary token is retrieved from the token file 208 by the decoder 122 in the order it was received. Next at step 408 a test is made to determine if the end of the file has been reached. When the end of the file has been reached at step 408 the text file 406 is complete. When at step 408 the end of file has not been reached the decoder 122 continues at step 410.

At step 410 a test is made to determine if the data word retrieved at step 404 is a command token. When the data word retrieved is not a command token at step 410, then at step 412 the data word is interpreted as a primary token and text corresponding to the primary token received is retrieved from the token table 114 and appended to the text file 406. The first data symbol of the primary token is tested at step 413 for a first value (binary 1) or a second value (binary 0). When at step 413 the first data symbol has the first value a leading delimiting space charter is added to the decoded text. When at step 410 the primary token retrieved is a command token, the decoder 122 continues at step 414.

At step 414 a test is made to determine whether the primary token retrieved at step 404 is a capitalize entire message command token. When the primary token received is a capitalize entire message command token then at step 416 all previous text added to the text file 406 and all text to be added to the file will be capitalized. Next the decoder 122 continues at step 404 where the next data word is retrieved. When at step 414 the primary token received is not a capitalize entire message command token then the decoder 122 continues at step 418.

At step 418 a test is made to determine if the primary token retrieved at step 404 is a group capitalization command token. When the primary token received is a group capitalization command token, then at step 420 all the succeeding characters, including phrases, will be capitalized until the next space token or a token having the first data symbol set indicating a leading delimiting space character. When at step 420 the next token following a group capitalization command is a mini-token command then all text decoded from a mini-token sequence will be capitalized. Next the decoder 122 continues at step 404 where the next primary token is retrieved. When at step 418, the token received is not a group capitalization command token then the decoder 122 continues at step 426.

At step 426 a test is made to determine if the primary token retrieved at step 404 is a capitalize next character command token. When the token received is a capitalize next character command token, then at step 422 the next character decoded will be capitalized. Next the decoder 122 continues at step 404 where the next primary token is retrieved. When at step 426, the token received is not a capitalize next character command token then the decoder 122 continues at step 434.

At step 434 a test is made to determine if the primary token retrieved in step 404 is a mini-token command token. When the primary token retrieved is not a mini-token command token then the decoder 122 continues at step 404 where the next primary token is retrieved. When at step 434 the primary token retrieved is a mini-token command token then the decoder 122 goes to step 430. At step 430 the number of mini-tokens to be received, as specified in the mini-token header, is retrieved. The number can be specified in one of at least two ways, as described above with reference to FIG. 2. Next at step 431 the next mini-token is received and the corresponding character is retrieved from the token table 114 and appended to the text file 406. Then at step 432 a test is made to determine if all the mini-tokens have been decoded by comparing the number of mini-tokens decoded with the number of mini-token specified in the in the mini-token header. When at step 432, it is determined that more mini-tokens are to be decoded the decoder 122 continues at step 431 at which the next mini-token is retrieved.

When at step 432, it is determined that the last mini-token of this group has been decoded, then at step 436 the decoder 122 returns to decoding data words of the first symbol length. It will be appreciated that the decoding is in synchronization with the a bit pattern of the initial series of primary tokens decoded and continues at step 404 where the next data word is retrieved. Because the encoder 124 has added the appropriate number of fill bits to the encoded message to maintain synchronization with the initial series of primary tokens encoded, any errors that may cause the process to revert to mini-tokens improperly or to decode the incorrect number of mini-token will be nullified at the point where the encoded message is based on the first symbol length. This system is especially effective when the over the air protocol is based on a block coding and the first symbol length has an integer relationship to the block size. For example the Post Office Code Standards Advisory Group (POCSAG) protocol encodes the input data and decodes the output data into blocks of twenty bits and the example described herein has a first symbol length of ten bits.

Figure 5:
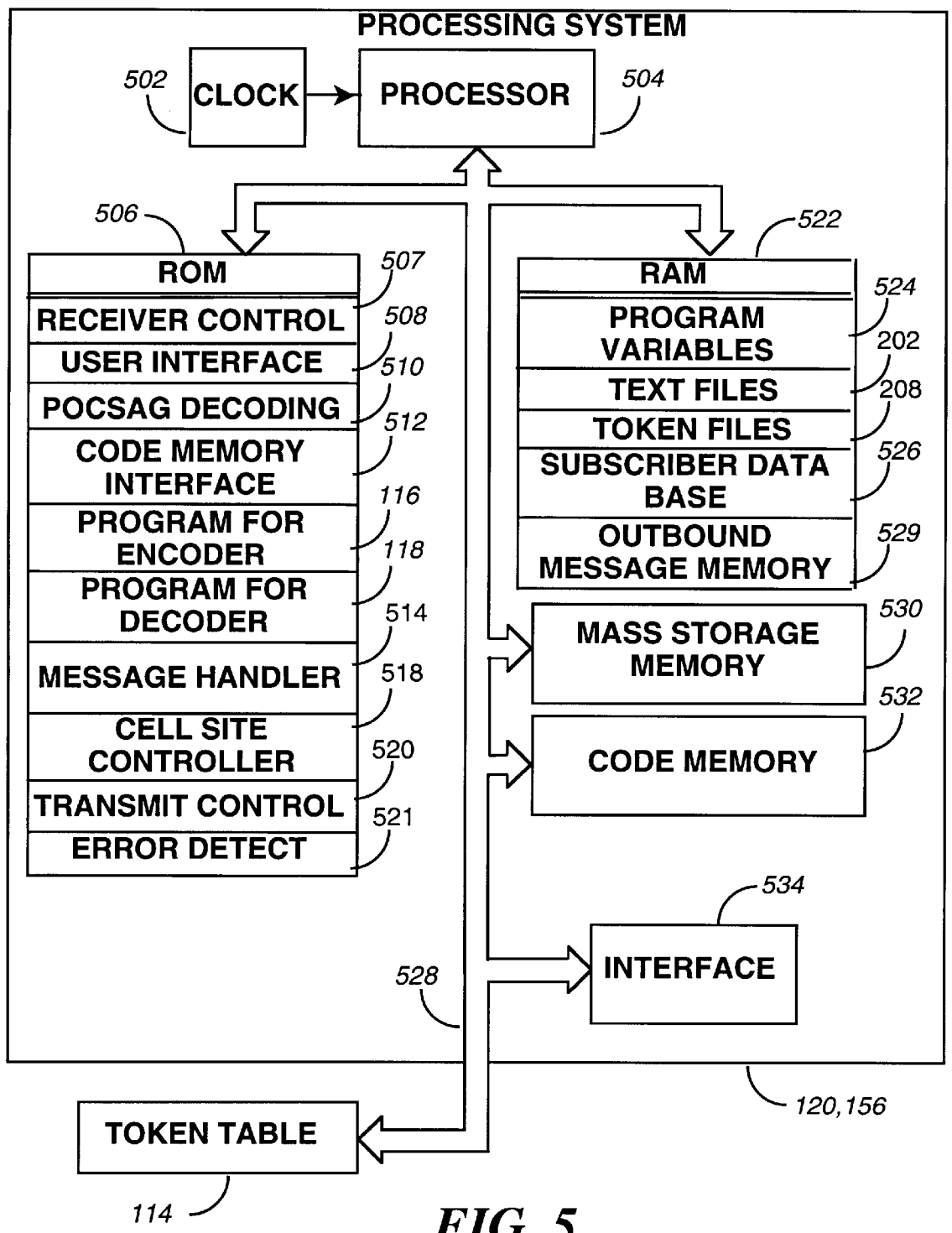
FIG. 5 is a block diagram of the processing system used to perform the steps of text compression shown in FIG. 3 and the steps of text decompression shown in FIG. 4, in accordance with the preferred and alternative embodiments of the present invention.

FIG. 5 is a block diagram of the processing system 120 used in the paging terminal 110 and the processing system 156 used in the subscriber unit 142. The functions of the processing system 120 and the processing system are very similar, however it will be appreciated by one skilled in the art that the many of the components used in the two systems may be different because of the differences in the processing speed, memory requirements and power supply limitations between the paging terminal 110 and the subscriber unit 142. The processing system 120 and the processing system 156 perform functions including the message handler functions described above, which are conventional, and functions described above with reference to FIG. 3 and FIG. 4, which are unique. The conventional and unique functions are executed by the conventional computer system and controlled by a set of program instructions stored in a memory. The unique functions are controlled by a unique set of program codes generated using conventional programming tools.

The processing system 120 and processing system 156 comprise a central processor unit (CPU) 504 coupled to a clock to provide the basic timing for the system. The CPU 504 is also coupled to a read only memory (ROM) 506, a random access memory (RAM) 522, a system interface 534 and the token table 114 via the system address and data bus 528. In the paging terminal 110, the system interface 534 provides the interface between the processing system 120 and the functions the processing system 120 is controlling in the paging terminal 110. In the subscriber unit 142, the system interface 534 provides the interface between the processing system 156 and the functions the processing system 156 is controlling in the subscriber unit 142. The processing system 120 used in the paging terminal 110 is typically coupled to a mass storage memory 530, such as a disk drive storage system, while the processing system 156 used in the subscriber unit 142 is typically coupled to a non volatile code memory 532 such as an electrically erasable programmable read only memory (EEPROM) 506 for storing a unique address identifying the subscriber unit 142.

The processing system 120 used in the paging terminal 110 preferably includes a conventional computer system for the CPU 504, preferably comprising a plurality of processors such as VME Sparc processors manufactured by Sun Microsystems, Inc. The ROM 506, the clock 502, and the RAM 522 are constructed on the same printed circuit board. It will be appreciated by one skilled in the art that much of the data stored in the ROM 506 can be stored in the mass storage memory 530 and loaded into the RAM 522 when needed.

The ROM 506 used in the paging terminal 110 includes the following digital encoded instructions to perform the following functions: A function for receiver control 507, a function for user interface 508, a function for POCSAG decoding 510, a function for compressive encoding 116, a function for compressive decoding 118, a function for the message handler 514, a function for the cell site controller 518, a function for transmit control 520 and a function for error detection 521. The RAM 522 used the paging terminal 110 include temporary storage for the following data: Program variables 524, text files 202, token files 208 subscriber data base 526 and an outbound message memory 529.

The processing system 156 used in the subscriber unit 142 preferably includes a conventional CPU 504, such as a microprocessor in the family of 68HC11 microprocessors manufactured by Motorola, Inc., of Schaumburg, Ill.

The ROM 506 used in the subscriber unit 142 includes the following digital encoded instructions to perform the following functions: A function for receiver control 507, a function for user interface 508, a function for POCSAG decoding 510, a function for selective call and code memory interface 512, a function for compressive encoding 116, a function for compressive decoding 118, function for the message handler 514, a function for transmit control 520, and a function for error detection 521. The RAM 522 used for the subscriber unit 142 includes temporary storage for the following data: Program variables 524, text files 202, token files 208 and an outbound message memory 529.

It will be appreciated that other types of conventional computer systems can be utilized for the processing system 120 and the processing system 156, and that additional computer systems and mass storage memory 530 of the same or alternate type can be added as required to handle the processing requirements of the processing system 120 and the processing system 156.

It will be further appreciated that one or more sets of secondary tokens could have a data symbol length longer instead of shorter than the primary data symbol length of the primary tokens as described in the preferred embodiment of the present invention. For example, in an alternative embodiment of the present invention, the primary tokens can be eight bits long, while secondary tokens have lengths of four and eight bits. In another alternative embodiment of the present invention, the primary tokens can be four bits and the secondary tokens five bits and ten bits. Longer secondary lengths are more likely be appropriate in systems having a large number of often-used long sequences of characters. In either of these alternative embodiments the use of filler symbols is advantageous for the same reasons as described above with respect to the preferred embodiment; that is, to maintain word synchronization with respect to the primary tokens so that if errors occur due to fading, an entire remainder of a message is not lost. When the primary token has the shortest length and the lengths of all secondary tokens are integral multiples of the length of the primary token, filler symbols are probably not necessary. The choice of token data symbol lengths is, however dependent upon other factors, such as the statistics of the information being encoded, the complexity of the hardware being used, and other encoding techniques (such as the delimiter technique and capitalization technique describe above), and the word length used in the signaling protocol which carries the information. Thus, the secondary tokens can have a length other than an integral multiple of the length of the primary token and the use of filler symbols will typically be beneficial.

It will be further appreciated that the compression benefit of the unique delimiter technique of using one symbol to indicate a space (or other delimiting character) is also realized when the unique delimiter technique is used independently from other techniques described herein.

Similarly, the compression benefit of each of the unique capitalization techniques involving the capitalization commands is also realized when the unique capitalization techniques are used independently from one another and from other techniques described herein.

Similarly, the compression benefits provided by the unique fill symbol technique, in which fill symbols are used to minimize the harmful effects of error propagation, is also realized when the unique fill symbol technique is used independently from other techniques described herein.

Similarly, the compression benefits provided by the unique mini-token sequence length identifying techniques of either using a revert secondary token or a mini-token header is also realized when either of the techniques is used independently from each other and independently from other techniques described herein.

It will be further appreciated that the techniques described above can be used in devices which compress or decompress in only one direction. For example, a one way pager, which is a selective call radio that only receives radio signals, includes the receiving subsystem 158 and not the transmitting subsystem 148. A paging terminal 110 which communicates only to one way pagers would only need the transmitting subsystem 126.

By now it should be appreciated that the present invention described herein provides an improved fixed dictionary technique for compressively encoding and decoding short text messages. The technique used by the present invention would, of course provide compression of a long message as well.

I claim:

1. A transmitter subsystem for compressively encoding and transmitting a text portion of a message, wherein the message comprises data symbols, and wherein characters in a text portion of a message are encoded using tokens, and wherein each token represents a unique sequence of one or more characters stored in two or more token tables and matched within the text portion of the message, and wherein primary tokens are tokens having a first data symbol length, and wherein secondary tokens are tokens having a second data symbol length different from the first data symbol length, and wherein the transmitter subsystem comprises:

a memory that stores the two or more token tables;

a processing system, coupled to said memory, that compressively encodes the characters by generating a sequence by adding a quantity of fill symbols to a string of the secondary tokens that encode a subset of the characters, wherein the symbol length of the secondary tokens are not necessarily one of an integral multiple and divisor of the symbol length of the primary tokens, and wherein the string has a length not exceeding a maximum predetermined length, and wherein the quantity of fill symbols is determined such that a total quantity of the data symbols in the sequence is equal to an integral multiple of the quantity of the data symbols in the first data symbol length, adding a command token immediately preceding the sequence, which indicates a start of the sequence, wherein the command token has the first data symbol length, and encoding characters that follow the sequence using one or more primary tokens following the sequence; and a transmitter that transmits a signal including the text portion of the message comprising the characters compressively encoded by said processing system.

2. The transmitter subsystem according to claim 1, wherein the command token includes data symbols which indicate the second data symbol length of the secondary tokens in the sequence.

3. The transmitter subsystem according to claim 1, wherein said processing system adds a token sequence header immediately after the command token, and wherein the token sequence header includes an indication of a length of the sequence as one of a quantity of first data symbol lengths and second data symbol lengths.

4. The transmitter subsystem according to claim 3, wherein the token sequence header has the first data symbol length.

5. The transmitter subsystem according to claim 3, wherein the token sequence header has the second data symbol length, and wherein when said processing system adds a quantity of fill symbols, the quantity of fill symbols is determined such that a total quantity of data symbols in the sequence includes the second data symbol length and is equal to an integral multiple of the first data symbol length.

6. The transmitter subsystem according to claim 1, wherein said processing system sets data symbols within the command token to indicate a unique sequence of one or more characters matched within the text portion of the message.

7. The transmitter subsystem according to claim 1, wherein said processing system sets data symbols within the command token to indicate a quantity of tokens having the second data symbol length, and wherein the tokens comprise the sequence.

8. The transmitter subsystem according to claim 1, wherein said processing system includes a revert command indicating an end of the sequence immediately after a last secondary token of the sequence, and wherein the revert command has the second data symbol length.

9. A transmitter subsystem for compressively encoding and transmitting a text portion of a message, said transmitter subsystem comprising:

a processing system that compressively encodes the text portion by determining a sequence of one or more characters stored in a token table and matched within the text portion of the message;

determining a token associated by the token table with the sequence of one or more characters;

setting a flag data symbol of the token to a first value and replacing, when the sequence of one or more characters is immediately preceded by a predetermined delimiting character the sequence of one or more characters and the immediately preceding predetermined delimiting character with the token; and setting a flag data symbol of the token to a second value and replacing the sequence of one or more characters with the token when the sequence of one or more characters is not immediately preceded by the predetermined delimiting character;

a memory, coupled to said processing system, that stores the token table; and a transmitter that transmits a signal including the text portion of the message compressively encoded by the processing system.

10. A receiver subsystem for receiving and decoding a compressed text portion of a message included in a signal, wherein the message comprises data symbols, and wherein characters in the compressed text portion have been encoded using tokens, and wherein each token represents a unique sequence of one or more characters stored in two or more token tables and matched within the compressed text portion of the message, and wherein primary tokens are the tokens having a first data symbol length, and wherein secondary tokens are tokens having a second data symbol length different from the first data symbol length, and wherein said receiver subsystem comprises:

a receiver that converts the signal into a demodulated signal;

a memory that stores the two or more token tables; and a processing system, coupled to said memory and said receiver, that decodes the data symbols from the demodulated signal;

separates the data symbols in the compressed text portion into data words having the first data symbol length, in order of receipt;

searches said data words for a command token indicating that a sequence of the secondary tokens follow consecutively thereafter; and decodes the data symbols which follow said command token in a string of secondary tokens having a length not exceeding a maximum predetermined length, by separating the data symbols in said sequence into secondary tokens;

replacing each secondary token in said sequence with a corresponding secondary character sequence found in the one or more token tables; and decoding data words that occur more than the maximum determined length after said command token as primary tokens wherein the symbol length of the secondary tokens are not necessarily one of an integral multiple and divisor of the symbol length of the primary tokens.

11. The receiver subsystem according to claim 10, wherein said processing system:

determines a length of the sequence included within the command token; and identifies an end of the sequence from the length of the sequence, and wherein said processing system decodes the data symbols by replacing each of the data words after the end of the sequence with a corresponding primary character sequence found in the one or more token tables.

12. The receiver subsystem according to claim 10, wherein said processing system:

decodes a token sequence header immediately following the command token;

determines a length of the sequence identified within the token sequence header;

identifies an end of the sequence from the length of the sequence; and replaces each of the data words after the end of the sequence with a corresponding primary character sequence found in the one or more token tables.

13. The receiver subsystem according to claim 10, wherein said processing system decodes the data symbols by identifying a predetermined secondary token which indicates an end of the sequence, and replacing each data word after the predetermined secondary token with a corresponding primary character sequence found in the one or more token tables.

14. The receiver subsystem according to claim 10, wherein the command token indicates a unique sequence of one or more characters matched within the compressed text portion of the message.

15. A receiver subsystem for receiving and decoding a compressed text portion of a message included in a signal, wherein the message comprises data symbols, and wherein characters in the compressed text portion have been encoded using tokens, wherein each token represents a unique sequence of one or more characters stored in one or more token tables in the receiver subsystem, said tables matched within the compressed text portion of the message, and wherein said receiver subsystem comprises:

a receiver that converts the signal into a demodulated signal;

a memory that stores the one or more token tables; and a processing system, coupled to said memory and said receiver, that decodes the data symbols from the demodulated signal;

separates the data symbols in the compressed text portion into data words;

replaces a data word with a sequence of the characters determined from a token table stored in said memory using a token derived from all but one data symbol of the data word; and places a delimiting character before the sequence of the characters when the one data symbol has a first value.

* * * * *